United States Patent
Lee et al.

[19]

[11] Patent Number: 5,963,825
[45] Date of Patent: Oct. 5, 1999

[54] METHOD OF FABRICATION OF SEMICONDUCTOR FUSE WITH POLYSILICON PLATE

[75] Inventors: Steven S. Lee; Gayle W. Miller, both of Colorado Springs, Colo.

[73] Assignee: Hyundai Electronics America, San Jose, Calif.

[21] Appl. No.: 07/935,301

[22] Filed: Aug. 26, 1992

[51] Int. Cl.⁶ .................................................. H01L 21/44
[52] U.S. Cl. ........................................ 438/601; 438/132
[58] Field of Search ................... 437/922; 148/DIG. 55; 257/529; 438/132, 601

[56] References Cited

U.S. PATENT DOCUMENTS

| | | | |
|---|---|---|---|
| 4,045,310 | 8/1977 | Jones et al. | 204/129.4 |
| 4,064,493 | 12/1977 | Davis | 365/96 |
| 4,198,744 | 4/1980 | Nicolay | 29/623 |
| 4,312,046 | 1/1982 | Taylor . | |
| 4,424,578 | 1/1984 | Miyamoto . | |
| 4,441,167 | 4/1984 | Principi | 365/94 |
| 4,476,375 | 10/1984 | Ogawa | 219/121 |
| 4,590,589 | 5/1986 | Gerzberg | 365/100 |
| 4,647,340 | 3/1987 | Szluk et al. . | |
| 4,651,409 | 3/1987 | Ellsworth et al. | 437/922 |
| 4,661,214 | 4/1987 | Young | 204/15 |
| 4,692,787 | 9/1987 | Possley et al. . | |
| 4,751,197 | 6/1988 | Wills | 437/174 |
| 4,903,111 | 2/1990 | Takemae et al. | 257/529 |
| 4,947,020 | 8/1990 | Imamura et al. | 219/121.65 |
| 5,017,510 | 5/1991 | Welch et al. | 437/192 |
| 5,120,679 | 6/1992 | Boardman et al. | 437/195 |
| 5,241,212 | 8/1993 | Motonami et al. | 257/529 |
| 5,242,851 | 9/1993 | Choi | 437/49 |
| 5,244,836 | 9/1993 | Lim | 437/192 |
| 5,258,643 | 11/1993 | Cohen | 257/530 |

FOREIGN PATENT DOCUMENTS

| | | | |
|---|---|---|---|
| 0241046 | 10/1987 | European Pat. Off. . | |
| 5220781 | 2/1977 | Japan . | |
| 5685846 | 7/1981 | Japan | 257/529 |
| 57-4139 | 1/1982 | Japan | 437/922 |
| 58-60560 | 4/1983 | Japan | 437/922 |
| 5864061 | 4/1983 | Japan . | |
| 1-77141 | 3/1989 | Japan | 257/529 |
| 3124047 | 5/1991 | Japan | 257/529 |
| 986198A | 3/1985 | U.S.S.R. . | |
| 2005078 | 9/1978 | United Kingdom | 257/529 |
| 9304499 | 4/1993 | WIPO | 257/665 |

*Primary Examiner*—Jey Tsai
*Attorney, Agent, or Firm*—Townsend and Townsend and Crew LLP

[57] ABSTRACT

A fusible link and method for its fabrication. A polysilicon pad is formed on top of an insulating layer and covered with a second insulating layer. A trench is selectively etched into the second insulating layer exposing the top of the polysilicon pad. An fusible aluminum link is then formed over the second insulating layer and trench and conformal therewith. When a programming current is driven through the link, the aluminum melts and is absorbed by the polysilicon pad, thereby preventing the link's growback.

8 Claims, 3 Drawing Sheets

METHOD OF FABRICATION OF SEMICONDUCTOR FUSE WITH POLYSILICON PLATE

The present invention relates to a programmable read only memory (PROM). More particularly, it relates to a semiconductor fuse for a PROM and a method for fabricating the fuse.

CROSS REFERENCE TO RELATED APPLICATIONS

This application is related to application NCR docket 4943, entitled "Semiconductor Fuse and Method" by Steven S. Lee and Gayle W. Miller filed at the same time as the present application.

BACKGROUND OF THE INVENTION

Computers typically have a number of different types of memory devices for storing data. For example, a read only memory (ROM) is a semiconductor memory device in which data is permanently stored. The data cannot be overwritten or otherwise altered by the user. A ROM is also non-volatile which means that the data is not destroyed when power is lost. A ROM is "programmed" during its manufacture by making permanent electrical connections in selected memory cells. ROMs are useful wherever unalterable data or instructions are required. A disadvantage of ROMs is that their programming is determined during the design stage and can only be varied by redesigning the chip.

An alternative to a ROM is a programmable read only memory (PROM) which is programmable once after its manufacture. In one type of PROM, each memory cell is provided with an electrical connection in the form of a fusible link (fuse). There are a considerable number of known designs for fuses used in PROMs. Perhaps the most common is a metal link, such as tungsten, which is narrowed or necked down in one region. To blow the fuse, current is driven through the link. The current heats the link to its melting point and the link is broken. Usually, the link breaks in the necked down region because that is where the current density is highest.

A problem with existing fuse designs is referred to as "growback" or "metal migration". Growback is a phenomenon in which a fuse metal which has been blown grows back together to reconnect the fusible link. Although the physics of growback is not completely understood, if the link reconnects, data is lost—clearly an undesirable result.

OBJECTS OF THE INVENTION

It is therefore an object of the present invention to provide a new and improved semiconductor fuse and method for fabricating the same.

It is another object of the present invention to provide a fuse which is resistant to growback.

It is a further object of the present invention to provide an efficient and reliable method for fabricating small geometry fuses.

It is yet another object of the present invention to provide a method for fabricating a fuse in which a material which is used to absorb the melted fuse when it is blown also functions as an etch stop during the fabrication of the fuse.

It is yet a further object of the present invention to provide a fuse which combines localized heating of the fuse and the removal of melted fuse material.

It is still another object of the present invention to provide a fusible link in which the melted link is absorbed into a polysilicon plate to prevent growback of the fuse.

It is still a further object of the present invention to provide a reliable method for blowing a semiconductor fuse.

SUMMARY OF THE INVENTION

One form of the present invention is a method for fabricating a semiconductor fuse. A polysilicon pad is formed on top of an insulating layer and a fusible metal link is formed on top of and in contact with the pad. When a programming current is driven through the link, the metal melts and is absorbed by the polysilicon pad, thereby preventing the link's growback.

In an alternative embodiment, prior to forming the link, a second insulating layer is formed on top of the polysilicon pad and then selectively etched to provide a trench having a bottom formed by the polysilicon pad. The fusible link is then formed across the second insulating layer and trench and conformal therewith.

Another form of the present invention is a fusible metal link in a semiconductor. The link is in contact with a layer of material which absorbs the metal when melted.

Yet another form of the present invention is a fusible link having a break region which gets hotter than the rest of the link when subject to a programming current and is located proximate a layer of material which absorbs the link when heated. The break region also has a cross sectional area which shrinks before melting, when subjected to a programming current, thereby increasing the temperature of the link in the break region.

Another form of the present invention is a method for blowing a fusible link by passing an electric current therethrough. The heat needed to melt the link is confined to a predetermined region of the link, and the melted link is then removed by absorbing it into polysilicon located proximate the region.

DESCRIPTION OF A PREFERRED EMBODIMENT

Figure 1:
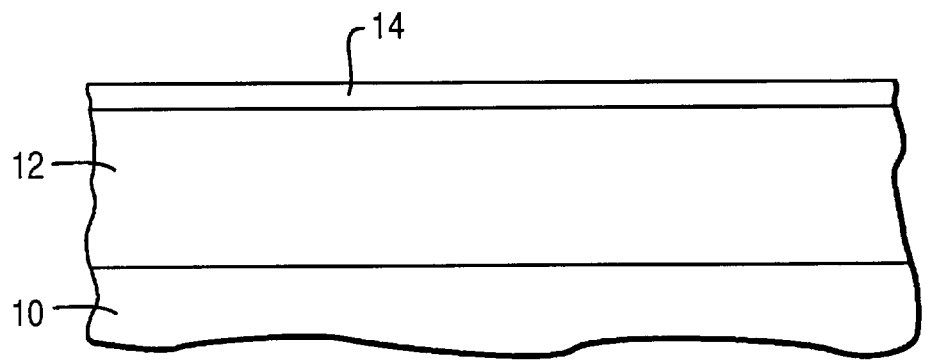
FIGS. 1–5 are sequentially selected cross sectional views at various stages of the fabrication of a semiconductor fusible link.
Figure 2:
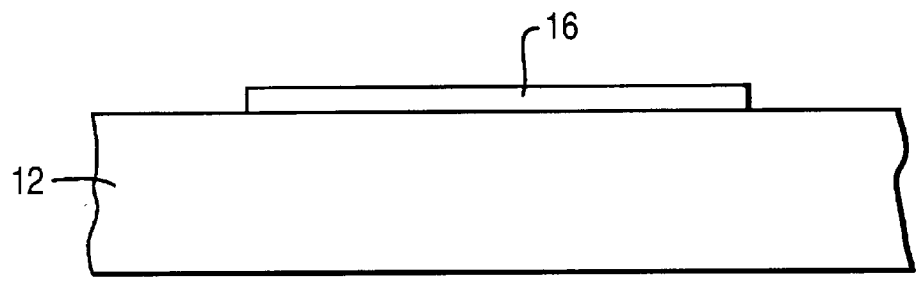

FIGS. 1–5 show selected views of a semiconductor device during the fabrication of a fusible link. As shown in FIG. 1, an insulating layer 12 is formed on top of a silicon substrate 10. Insulating layer 12 may be provided in many different ways. For example, insulating layer 12 may be a thermally grown $SiO_2$. Alternatively, layer 12 can be deposited or applied as a spin-on-glass, such as a boron phosphorous silica glass. It is also possible to form insulating layer 12 by forming multiple insulating layers using one or more of the above processes. A layer 14 of polysilicon is next deposited on top of insulating layer 12. Polysilicon layer 14 is then patterned with photoresist (not shown) and selectively etched to form polysilicon pad 16, as shown in FIG. 2.

Figure 3:
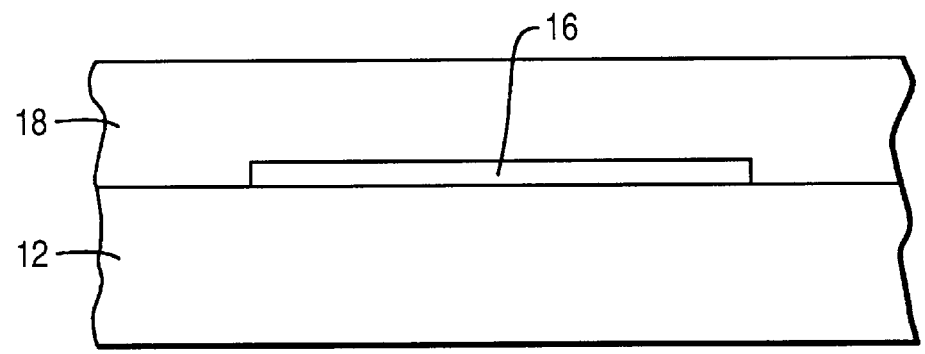

Reference is now made to FIG. 3. After polysilicon pad 16 is formed on top of insulating layer 12, a second insulating layer 18 is formed to cover polysilicon pad 16 and insulating layer 12. Preferably, insulating layer 18 is formed by depositing $SiO_2$ in a spin-on, sputtering or CVD deposition process.

Figure 4:
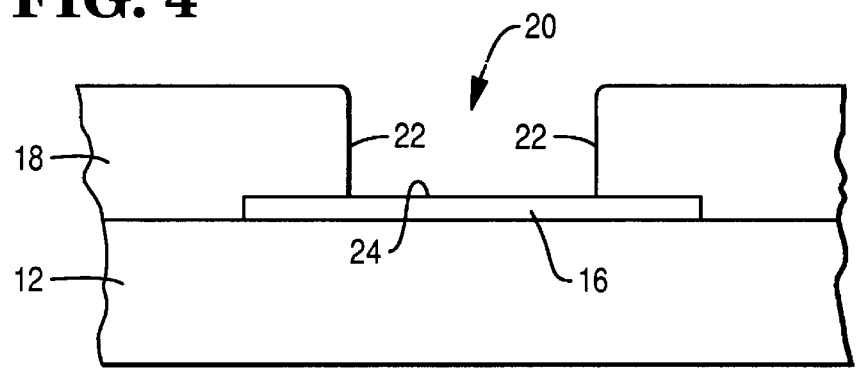

Insulating layer 18 is next patterned with photoresist (not shown) and selectively etched to provide a trench 20, as shown in FIG. 4. Trench 20 provides an opening through insulating layer 18 to polysilicon pad 16. Trench 20 has side walls 22 and a bottom surface 24 formed by an upper surface of polysilicon pad 16. A feature of the present invention is that polysilicon pad 16 functions as an etch stop during the selective etching of insulating layer 26 to form trench 20. As is known to those skilled in the art, a material is an "etch stop" when it has does not react with the chemical or chemicals used for etching the overlying layer. In other words, when the overlying insulating layer 18 is chemically etched, the trench formed is only as deep as the top of polysilicon pad 16. Polysilicon pad 16 plays another critical role (as will be explained later on) in the fuse design according to the present invention. Thus, polysilicon pad provides dual functionality which results in lower manufacturing cost and higher quality of resulting parts.

Figure 5:
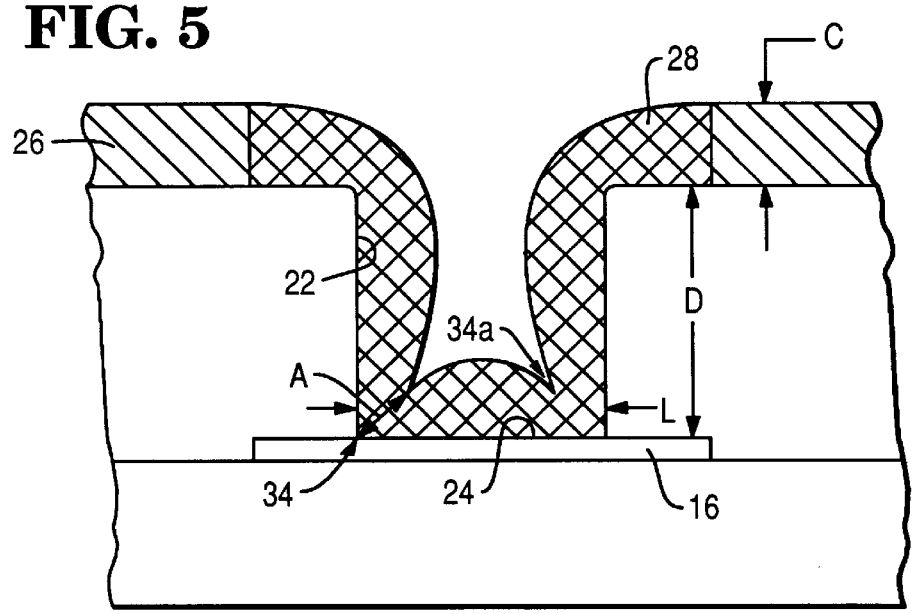

Referring to FIG. 5, a fusible link 26 is formed across insulating layer 18 and trench 20. Link 26 is formed by first depositing a layer of link material over the exposed surface of insulating layer 18 and trench 20. The link material is preferably a metal and more specifically aluminum (Al). The aluminum is deposited conformally with layer 18 and the surfaces defining trench 20. In this context, "conformally" means that the aluminum generally conforms to the upper surface of insulating layer 18, sidewalls 22 of trench 20 and the bottom surface 24 of trench 22. However, "conformally" does not mean that the outer surface of the aluminum is exactly geometrically similar to the surface on which it is deposited. The degree to which the material is not similar is influenced by the dimensions of trench 20, as will be described below.

Figure 6:
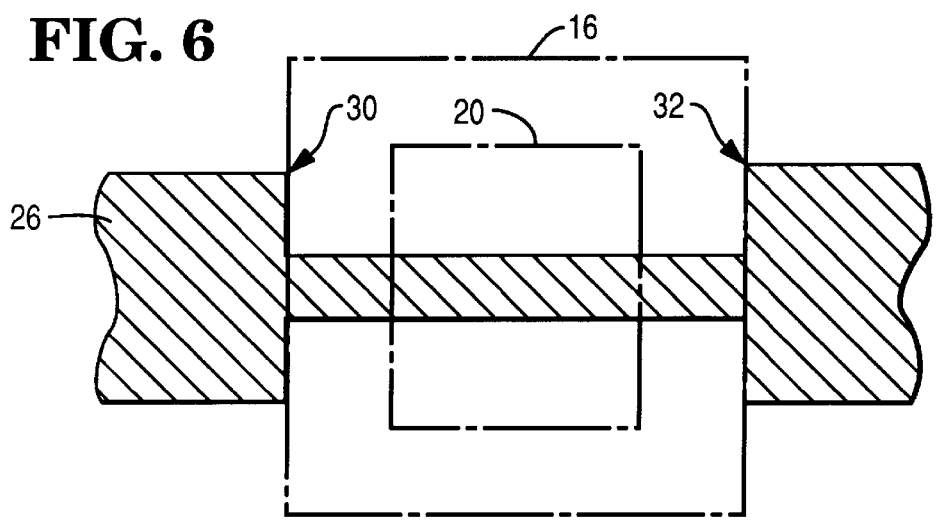
FIG. 6 is top view of the fusible link shown in FIG. 5. Selected hidden lines are shown in phantom.

After depositing the aluminum, photoresist is applied and the aluminum is patterned into a conductive line by selective etching. FIG. 5 shows a cross sectional side view and FIG. 6 shows a top view of the resulting link 26. As can be best seen in FIG. 6, link 26 has a narrowed or necked down region 28 which has a smaller width then the rest of the fuse. Necked down region 28 is bounded by transition regions 30 and 32. Each region 30 and 32 marks the transition between the wider portion of fusible link 26 and necked down region 28. As shown in FIG. 6, necked down region 28 overlies trench 20.

Referring again to FIG. 5, it can be seen that fusible link 26 has a generally uniform thickness except in a break region 34 where it is significantly thinner. Break region 34 occurs where necked down region 28 on link 26 meets the intersection of sidewall 22 and bottom surface 24 of trench 20. This thinning of link 26 in region 34 is caused by the shadowing effect when depositing material in a small geometry trench. Preferably, trench 20 has a small length (L) and a somewhat larger depth (D). The ratio of depth to length is referred to as the aspect ratio. Preferably, D/L>1. The larger the aspect ratio, the greater the shadowing effect caused by the deposition.

The larger the aspect ratio, the greater the shadowing effect caused by the deposition. The "shadowing effect" occurs during the deposition process because the sputtered flux is not completely perpendicular to the substrate. When the substrate includes a trench, the top corners of the trench receive more flux than the bottom corners of the trench. Thus, the bottom of the trench is said to be shadowed in much the same way as it would were non-perpendicular light beams lighting the substrate from above. FIG. 5 shows a characteristic shadowing profile of a deposited link material. Break region 34 also occurs in necked down region 28 of link 26 where both the thickness and width of link 26 are minimal. Thus, the cross sectional area of link 26 is a minimum at break region 34. It will be appreciated, that on the opposite side of trench 20 there is another break region 34a which has roughly the same minimum cross sectional area as break region 34.

In operation, if fusible link 26 is to be "blown", a programming current in excess of the normal operating current is passed through link 26. Current passing therethrough, heats link 26. Since the minimum cross sectional area occurs in break region 34, the current density and hence the heating will be its greatest in break region 34. Thus, when subject to a programming current, break region 34 gets hotter than the rest of link 26. Because of the geometry of break region 34 and its proximity to polysilicon pad 16, the cross sectional area of break region 34 actually shrinks prior to melting which further increases its temperature. This shrinking is caused by some initial absorption of aluminum by the polysilicon pad 16 prior to the aluminum actually melting. When the temperature is sufficiently high, link 26 melts. The melted material of link 26 is then absorbed by polysilicon pad 16. It will be appreciated that a similar effect can simultaneously occur at break region 34a so that either region 34 or region 34a or both break when subjected to a programming current.

The term "absorb" as used herein means to form a solid solution in which the absorbing and absorbed materials do not form a compound. For example, if aluminum is melted over top of $SiO_2$, the compound $Al_2O_3$ is formed. However, when aluminum is melted over silicon, the aluminum is pulled into the silicon, but the aluminum and silicon do not react to form another compound.

In effect, the present fusible link design allows the heat needed to melt the link to be confined to break region 34. This localized heating intensifies when the cross sectional area of break region 34 shrinks. Once the link is melted, the metal is effectively removed by its absorption into polysilicon pad 16. The metal absorbed by polysilicon pad 16 will not thereafter migrate back into the region. Thus, the possibility that the fusible link will reconnect itself over time is greatly reduced as compared to prior art designs.

Figure 7:
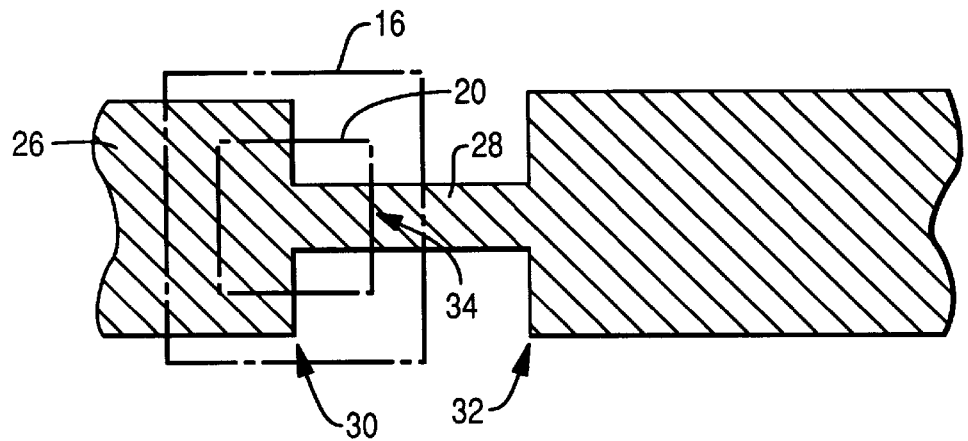
FIG. 7 is a view similar to that shown in FIG. 6 but according to an alternative embodiment of the present invention.
Figure 8:
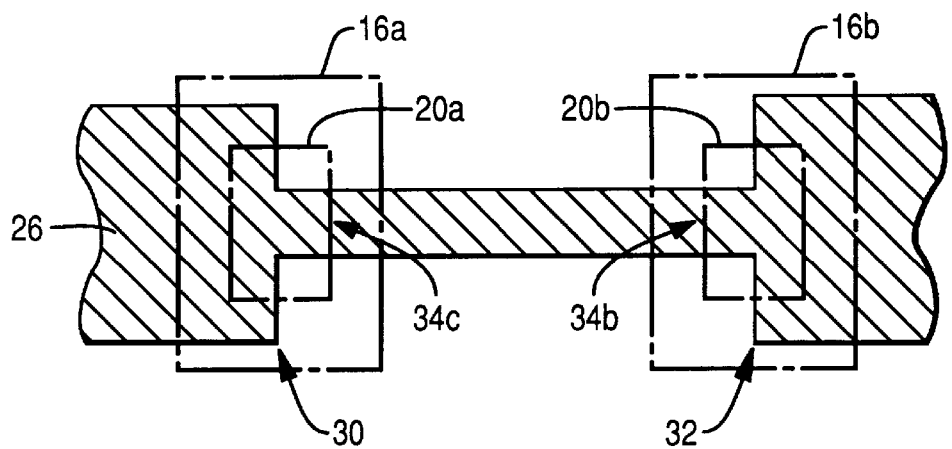
FIG. 8 is a view similar to that shown in FIG. 6 but according to an alternative embodiment of the present invention.
Figure 9:
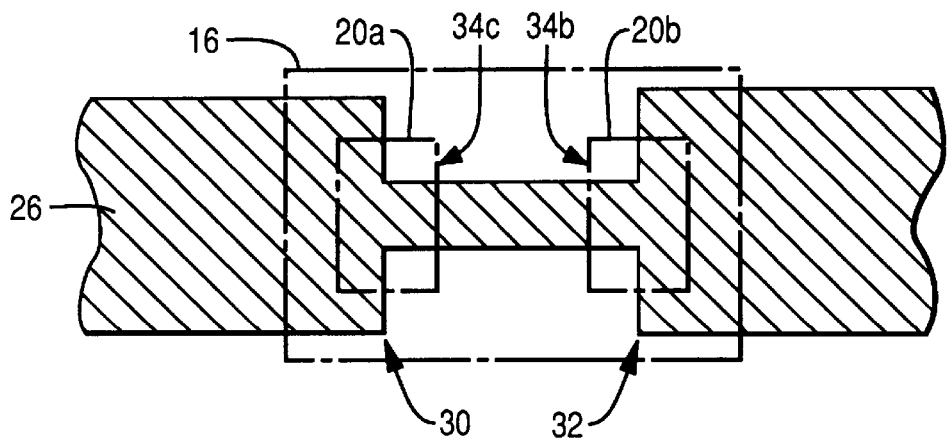
FIG. 9 is a view similar to that shown in FIG. 6 but according to an alternative embodiment of the present invention.

FIGS. 7–9 show fusible link designs according to alternative embodiments of the present invention. In each of FIGS. 7–9, a fusible link 26 having a necked down region 28 is formed in the manner described above. In each of these embodiments at least a portion of necked down region 28 overlies trench 20.

In FIG. 7, transition region 30 overlies trench 20; however, transition region 32 does not overlie trench 20. This should be compared to FIG. 6 in which neither transition region 30 nor 32 overlies trench 20. Thus, only a single break region 34 for fusible link 26 is formed. This configuration has the advantage of being more compact than that shown in FIG. 6, which results in higher density PROM designs.

In FIG. 8, two polysilicon pads 16a and 16b are formed and two trenches 20a and 20b are etched into an overlying insulating layer to provide contact regions for fusible link 26. Transition regions 30 and 32 of fuse 26 overlie trenches 20a and 20b, respectively. In this way, a single break region 34c and 34b is provided for each trench 20a and 20b, respectively.

In FIG. 9, a single polysilicon pad 16 is formed and two trenches 20a and 20b are etched into an overlying insulating layer to provide contact regions for fusible link 26. Transition regions 30 and 32 of fuse 26 overlie trenches 20a and 20b, respectively. In this way, a single break region 34c and 34b is provided for each trench 20a and 20b, respectively. This configuration provides redundancy.

It will be clear to those skilled in the art that the present invention is not limited to the specific embodiment disclosed and illustrated herein. For example, the fusible link could be formed over a polysilicon pad without the use of a trench. Furthermore, a fusible link design employing principles of the present invention includes the use of materials having properties similar to aluminum and silicon which are disposed proximate each other.

It will be understood that the dimensions and proportional and structural relationships shown in the drawings are illustrated by way of example only and these illustrations are not to be taken as the actual dimensions or proportional structural relationships used in the semiconductor fusible link of the present invention.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A method for fabricating a semiconductor fuse, comprising:

providing a first insulating layer;

forming a polysilicon pad on top of said layer;

forming a second insulating layer which covers said polysilicon pad and first insulating layer;

selectively etching said second layer to provide a trench having sidewalls in said second insulating layer and a bottom formed by an upper surface of said polysilicon pad; and forming a fusible link across said second layer and trench and conformal therewith;

wherein a programming current through said link melts said link, and said polysilicon pad absorbs the link when melted, thereby preventing the link's growback.

2. The method of claim 1 wherein said pad functions as an etch stop for the selective etch of said second insulating layer.

3. The method of claim 1 wherein said step of forming said fusible link includes:

depositing a layer of metal over said second layer and trench; and patterning said metal to form said link.

4. The method of claim 3 wherein said link is patterned into a conductive line having a necked down region, wherein said necked down region is bounded by first and second transition regions, and wherein at least a portion of said necked down region overlies said trench.

5. The method of claim 4 wherein said link melts at a break region, said break region occurring where said necked down region meets the intersection of a sidewall and polysilicon pad.

6. The method of claim 5 wherein said first transition region but not said second transition region overlies said trench.

7. The method of claim 5 wherein neither said first nor said second transition region overlies said trench.

8. The method of claim 5 wherein said selective etching step includes:

providing a second trench having sidewalls in said second insulating layer and a bottom formed by an upper surface of said polysilicon pad;

wherein said first and second transition regions overlie said respective trenches.

* * * * *